United States Patent [19]

Kahng et al.

[11] 3,964,085

[45] June 15, 1976

[54] METHOD FOR FABRICATING MULTILAYER INSULATOR-SEMICONDUCTOR MEMORY APPARATUS

[75] Inventors: Dawon Kahng, Bridgewater Township, Somerset County; Ernest Edward La Bate, South Plainfield; Martin Paul Lepselter, Summit; Joseph Raymond Ligenza, Califon, all of N.J.

[73] Assignee: Bell Telephone Laboratories, Incorporated, Murray Hill, N.J.

[22] Filed: Aug. 18, 1975

[21] Appl. No.: 605,312

[52] U.S. Cl. .............................. 357/23; 357/24; 357/54; 427/85; 427/126; 427/255
[51] Int. Cl.² ............... H01L 11/00; H01L 15/00; B05D 5/12
[58] Field of Search .............. 427/85, 126, 255; 357/23, 24, 54

[56] References Cited
UNITED STATES PATENTS 3,665,423  5/1972  Nakanuma ..................... 340/173
3,877,054  4/1975  Boulin et al. .................... 357/23

OTHER PUBLICATIONS

L. Holland, "Vacuum Deposition of Thin Films", Wiley & Sons, Inc., N.Y., 1956, pp. 122–125, 210–211, 448–453 and 482–483.

Per Kofstad, "High-Temperature Oxidation of Metals", Wiley & Sons, Inc., N.Y., 1966, pp. 251–261.

Primary Examiner—Cameron K. Weiffenbach
Attorney, Agent, or Firm—D. I. Caplan

[57] ABSTRACT

An $SI_1I_2M$ (semiconductor-insulator$_1$-insulator$_2$-metal) memory structure, containing an impurity such as tungsten concentrated in a region including the interface ("$I_1I_2$") region between the $I_1$ and $I_2$ region, is fabricated by depositing an oxide of the impurity, such as tungsten trioxide, on the then exposed, $I_1$ layer prior to fabricating the $I_2$ layer. The oxide of the impurity, such as tungsten trioxide, can be advantageously deposited by means of reactive evaporation.

16 Claims, 2 Drawing Figures

METHOD FOR FABRICATING MULTILAYER INSULATOR-SEMICONDUCTOR MEMORY APPARATUS

FIELD OF THE INVENTION

This invention relates to semiconductor apparatus, and more particularly to processes for fabricating semiconductor memory devices which contain a multilayer insulator contacting the semiconductor.

BACKGROUND OF THE INVENTION

In the prior art of semiconductor memory apparatus, $SI_1I_2M$ layered structures have been used as memory devices. Here, "S" denotes a semiconductor substrate or layer; "$I_1$" and "$I_2$" denote first and second insulator layers, respectively; and "M" denotes a metal electrode layer. For electrical erase of this $SI_1I_2M$ structure, a positive voltage is applied to the metal electrode, so that the captured electrons (if any) are transported back to the metal by means of Fowler-Nordheim tunneling in the opposite direction from that during the write-in. In such a memory device, the presence versus absence of captured electrons at surface states at the $I_1I_2$ interface of the insulator layers defines the memory state of the device.

Other types of $SI_1I_2M$ structures in the prior art rely upon the phenomenon of tunneling of charge carriers between the $I_1I_2$ interface and the semiconductor, rather than the metal electrode. Again, the presence versus absence of captured electrons at the $I_1I_2$ interface state defines the memory state of the device.

The above-mentioned $SI_1I_2M$ structures can be incorporated in integrated circuit arrays for mass memories, as known in the art. In such arrays, instead of measuring capacitance of a two-terminal device as previously described, each of the $I_1I_2M$ portions of many such $SI_1I_2M$ structures is advantageously fabricated as the gates of insulated gate field effect transistors (IGFET's), in which the gates are all integrated on a single semiconductor substrate. As also known in the art, these arrays can be addressed for selective write-in, readout, and erase by various selective crosspoint electrical circuit techniques, such as described for example in U.S. Pat. No. 3,665,423 issued to S. Nakanuma et al. on May 23, 1972.

As set forth in U.S. Pat. No. 3,877,054, issued to Boulin et al. on Apr. 8, 1975, the interface states in the region of the $I_1I_2$ interface of $SI_1I_2M$ memory devices can be controlled and stabilized by introducing dispersed impurity metal atoms such as tungsten, in a surface concentration between about $10^{14}$ and $2 \times 10^{15}$ per square centimeter the interface region. By "dispersed" is meant that the impurities do not clump or cluster together, which would form a Fermi level characteristic of the impurity itself. These impurity atoms also serve to increase the capture (trapping) efficiency of electronic charge carriers (electrons or holes), particularly those charge carriers which can be transported from the semiconductor (or metal) to the $I_1I_2$ interface region by the phenomenon of Fowler-Nordheim tunneling to the interface states.

In the aforementioned Boulin et al. U.S. Pat. No. 3,877,054, it was suggested to introduce tungsten impurities by evaporation techniques or by purposely including a mixture of some tungsten halide impurites with an aluminum halide advantageously only during an initial stage of chemical vapor deposition of aluminum oxide as the $I_2$ layer. However, tungsten evaporation techniques entail the use of relatively large amounts of costly ultra-pure tungsten sources (when compared to the exceedingly small amounts of tungsten deposited in the $I_1I_2$ interface), high evaporation temperatures (in excess of 3000°C), which consumes large amounts of energy, and furthermore require careful and skilled operators to control the process. Moreover, the inclusion of tungsten halide as an impurity in the initial phase of chemical vapor deposition of aluminum oxide tends to produce an $I_2$ layer of poor electrical quality, thereby degrading charge storage times in the final device. Therefore it would be desirable to have more economical and easily controllable techniques for introducing metallic impurities, such as tungsten, into an $I_1I_2$ interface region of a $SI_1I_2M$ memory device.

SUMMARY OF THE INVENTION

In order to fabricate an $SI_1I_2M$ memory structure with a molecularly dispersed metallic impurity, such as tungsten, in an $I_1I_2$ interface region, an oxide of the impurity is deposited on the then exposed $I_1$ layer just prior to deposition of the $I_2$ layer. For example, oxide(s) of tungsten, typically tungsten trioxide, is deposited on the exposed $I_1$ layer by means of a reactive evaporation of tungsten with oxygen. In this way, somewhat higher concentrations of tungsten, (up to $4 \times 10^{15}$ nuclei of tungsten per square centimeter) can be deposited in a workable memory device, thereby decreasing the required write-in voltages during operation.

In a specific embodiment of the invention, a silicon dioxide ($I_1$) layer is grown on a monocrystalline silicon semiconductor substrate. The surface of the silicon dioxide is exposed to a stream of tungsten trioxide molecules which are formed by the reaction of the surface of a heated solid tungsten body (about 1050°C to 1700°C) with oxygen gas at a low pressure (about $10^{-5}$ to $10^{-3}$ torr) in a vacuum chamber. The tungsten body can be in the form of a hollow circular cylinder into one end of which the oxygen gas flows and out of the other end of which the tungsten trioxide flows onto the exposed silicon dioxide surface. Alternatively, the tungsten body can take the form of a heated tungsten filament located inside a plurality of hollow concentric tungsten cylinders acting as radiation shields, and oxygen is introduced into one end of the innermost cylinder while tungsten trioxide flows out of the other end of the cylinder onto the exposed silicon dioxide surface. Thus, tungsten trioxide is deposited onto the exposed silicon dioxide surface by a chemically reactive evaporation process. The amount of deposited tungsten trioxide is controlled by the tungsten body temperature, oxygen pressure, and time of exposure of the silicon dioxide surface to the tungsten trioxide flow, as well as by the distance of separation between the silicon dioxide surface and the tungsten body. In this way, the total number of deposited tungsten nuclei can range somewhat higher than in the case of nonreactive evaporation of tungsten itself, rather than its oxides.

BRIEF DESCRIPTION OF THE DRAWINGS

This invention, together with its features, advantages and objects can be better understood from the following detailed description in conjunction with the drawings in which.

DETAILED DESCRIPTION

Figure 1:
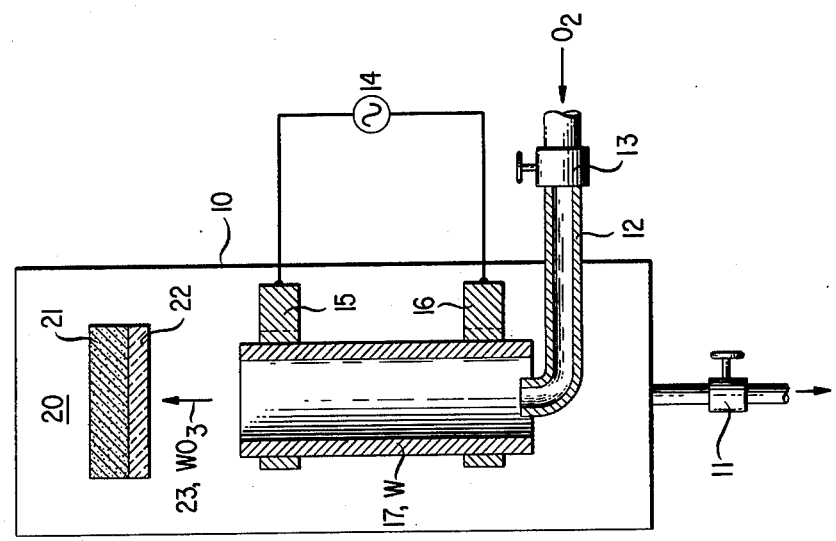
FIG. 1 is a cross section diagram of apparatus for carrying out the invention in accordance with specific embodiments.

As shown in FIG. 1, a vacuum chamber 10 is evacuated through an outlet pipe controlled by an outlet valve 11. Oxygen at low pressure is introduced into the chamber 10 through an inlet pipe 12 under the control of an inlet valve 13. The inner region of a hollow cylindrical tungsten tube 17 accepts the flow of oxygen from the unsealed outlet end of the pipe 12. This tungsten tube is typically pre-formed by a standard sodium-free chemical vapor deposition process and is heated by means of an A.C. electrical source 14 applied to a pair of tantalum straps 15 and 16 press-fitted to contact the outside wall of the tube 17 near opposite ends thereof. Typically the tungsten tube 17 is about 18 centimeters long, with an outside diameter of about 0.6 centimeters and a wall thickness of about 0.05 centimeters. At a distance typically of about 40 centimeters from the nearer end of the tube 17 is located a target 20 comprising a silicon semiconductor substrate layer 21 upon a major surface of which has been grown a silicon dioxide layer 22 typically by a conventional dry oxidation process. As a result of chemical reaction of the tungsten of the inner surface of the tube 17 with the oxygen stream emanating from the pipe 12, a stream 23 of oxides of tungsten flows onto the then exposed surface of the silicon dioxide layer 22. The target 20 is located typically about 40 centimeters from the nearer end of the tube 17.

Advantageously, the temperature of the tube 17 and the pressure of the oxygen flowing in this tube are advantageously adjusted to produce a significant component of tungsten trioxide in the stream 23. For this purpose, the chamber 10 is first evacuated through the valve 11 (while valve 13 is closed) to a pressure of typically about $10^{-7}$ torr, and then oxygen is bled through the partially open valve 13 into the chamber to produce a pressure of oxygen therein of advantageously about $5 \times 10^{-4}$ torr or less, typically about $5 \times 10^{-5}$ torr. The A.C. source 14 is pre-adjusted to maintain the tungsten tube 17 at a temperature of in the range of about 1050° to 1700°C, typically about 1150°C, in order to oxidize the tungsten and sublime the tungsten oxide at the inner surface of the tube 17 in response to the flowing oxygen. The stream 23 thus includes tungsten trioxide molecules which condense and are deposited on the then exposed major surface of the (unheated) silicon dioxide layer 22. The process of tungsten oxide deposition is terminated when the number of deposited tungsten nuclei reaches the desired amount, in the range of between about $10^{14}$ and $4 \times 10^{15}$ per square centimeter, advantageously between about $4 \times 10^{14}$ and about $2 \times 10^{15}$ per cm$^2$, for example about $7 \times 10^{14}$ per square centimeter. The deposition time required depends upon the various parameters as the pressure of oxygen, the temperature of the tungsten tube 17, and the separation of the target from the tungsten tube. Typically, this deposition rate on a single target 20 is of the order of $5 \times 10^{12}$ tungsten nuclei per square centimeter per second, so that exposure time is of the order of 100 seconds. The target 20 can advantageously be located on a rotating carousel containing many such similar targets which are sequentially moved into and out of the paths of the oxide stream 23. A shield is typically inserted in front of each target during the time periods when the deposition of tungsten oxide is not desired.

After the deposition of the tungsten oxide, the I$_2$ layer is then formed on the exposed I$_1$ (silicon dioxide) layer now containing the deposited tungsten nuclei. For example, aluminum oxide as the I$_2$ layer is deposited in the same chamber 10 by conventional aluminum halide chemical vapor deposition at an elevated temperature of typically about 900°C to a thickness in the range of about 300 to 700 Angstroms, typically about 500 Angstroms. Alternatively, the I$_2$ layer can be of other relatively high dielectric constant insulators compared to the I$_1$ layer, such as silicon nitride typically also from about 300 to 700 Angstroms thick. The I$_1$ layer 22 is, as described in the aforementioned Boulin et al. U.S. Pat. No. 3,877,054, advantageously between about 50 and 200 Angstroms thick, typically about 100 Angstroms of silicon dioxide grown by dry thermal oxidation of a major surface of the silicon substrate layer 21. At some sacrifice of charge storage times in the final memory device, this I$_1$ layer can be somewhat thinner, as little as about 20 Angstroms thick.

After fabrication of the I$_2$ on the I$_1$ layer, a metal electrode is applied to the exposed surface of the I$_2$ layer, in accordance with the poly-silicon gate technology, for example. Many memory devices can be fabricated on a single silicon substrate, together with access circuitry; and source and drain regions for forming insulated gate field effect transistors can be introduced together with further metallization in accordance with conventional integrated circuit techniques. Thereby, electrical access readout of the memory states of the devices with gain is achieved, as known in the art.

Figure 2:
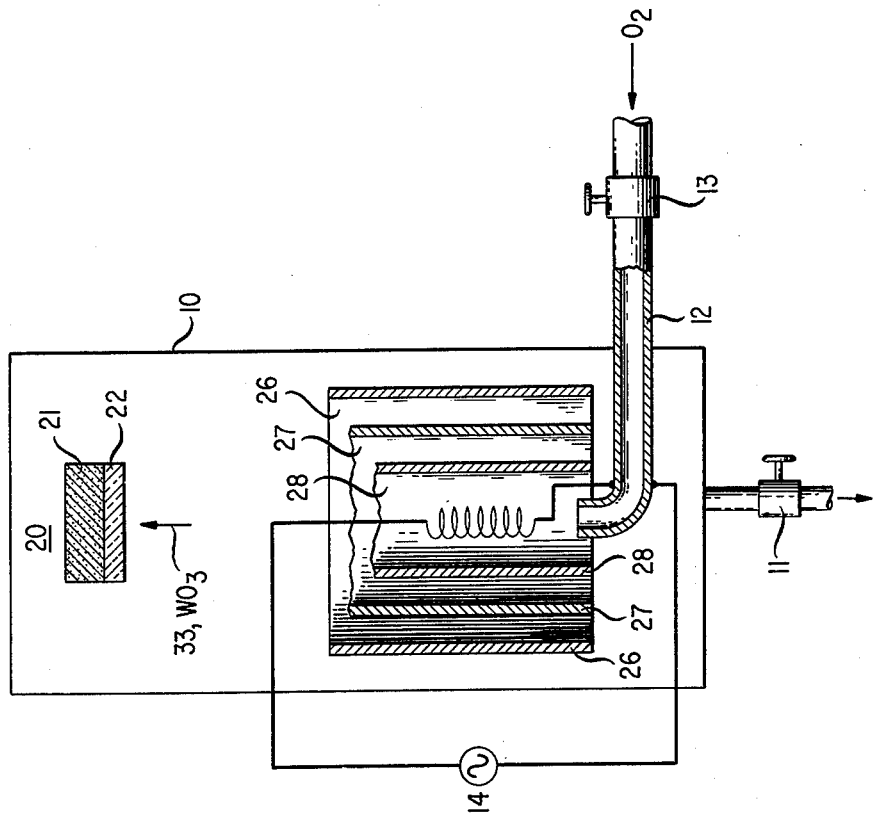
FIG. 2 is a cross section diagram of apparatus for carrying out the invention in accordance with another specific embodiment.

FIG. 2 illustrates the reactive evaporation of tungsten from a tungsten filament 29 rather than the tube 17. Many of the elements in FIG. 2 can be the same as in FIG. 1 and accordingly those elements have been denoted by the same reference numerals. Concentric hollow cylindrical radiation shields 26, 27 and 28 advantageously surround the filament 29, to prevent heat loss due to radiation. These shields are typically made of chemically vapor deposited tungsten, each of the order of 0.05 centimeters in wall thickness. The filament itself is of multiple stranded drawn tungsten, which should be sodium free, typically about 10 centimeters long with a filament thickness of about 0.08 centimeters, and has about 14 turns of inside diameter about 0.8 centimeters. The innermost shield 28 is typically about 10 centimeters long, about 0.05 centimeters in wall thickness, and has an inside (cylinder) diameter of about 1.5 centimeters. The tungsten filament is connected to copper leads from the A.C. source by means of metallic bolts and screws.

At a typical filament temperature of about 1140°C and a typical oxygen pressure of about $3 \times 10^{-5}$ torr, the tungsten trioxide deposition rate is about $8 \times 10^{12}$ atoms per square centimeter per second when the substrate target is located at about 25 centimeters from the filament. Thus, a target exposure time of about 1.5 minutes to the stream of tungsten oxide is useful for the deposition of about $7 \times 10^{14}$ tungsten nuclei per square centimeter in the form of tungsten oxide. As in the case of the tungsten tube 16, the oxygen pressure and the tungsten filament temperature can be varied over about the same limits. Whereas the tungsten tube 17 as the tungsten source has the advantage of ruggedness, the tungsten filament 29 has the advantage of ready commercial availability.

While this invention has been described in terms of specific embodiments, various modifications can be made without departing from the scope of the invention. For example, solid tungsten trioxide itself can be used as the source of the tungsten oxide stream, by heating it to a temperature of about 1130°C for example. Commercially pure tungsten trioxide, free of sodium oxide, is not readily available, however. Accordingly, since sodium oxide sublimes at 1275°C the source temperatures of the impure commercial tungsten trioxide should advantageously be kept lower than 1130°C for a sodium-free tungsten oxide deposit. With pure (sodium-free) tungsten trioxide, a source temperature of 1140°C is feasible.

Alternatively, also, the control over the amount of tungsten deposit can be achieved by pre-oxidizing a known amount of tungsten of a sodium-free tungsten filament, at a low temperature where tungsten oxide volatility is negligible, equal to the amount to be deposited. For example, a tungsten filament can be oxidized for about 15 minutes at about 800°C in 760 torr of oxygen, and placed in a vacuum chamber in proximity to the target and the tungsten filament is heated to a somewhat higher temperature of about 1130°C for sufficient time (15 minutes) in order to sublimate the entire pre-oxidized portion of the tungsten filament. Alternatively, much more than the desired amount of tungsten oxide to be deposited on the target can be pre-oxidized into the tungsten filament and the amount of deposited tungsten oxide into the target can be controlled by control over the source temperature and time of deposition as well as distance from source to target.

This invention can be practiced with a variety of methods for depositing tungsten oxides on the exposed silicon dioxide layer, in order to form the desired dispersed tungsten impurity nuclei. Moreover, other impurities such as oxides of platinum, iridium, tantalum or niobium may be used instead of tungsten; and other semiconductor substrates and insulators may also be used in conjunction therewith.

What is claimed is:

1. A semiconductor-insulator$_1$-insulator$_2$ layered structure made by a process which includes the step of depositing an oxide of a metallic impurity on the then exposed surface of the insulator$_1$ layer, prior to the fabrication of the insulator$_2$ layer, in an amount yielding between about $10^{14}$ and $4 \times 10^{15}$ metallic impurity nuclei per square centimeter.

2. A semiconductor-insulator$_1$-insulator$_2$-metal layered structure made by a process including the steps of
   a. forming the insulator$_1$ layer on the semiconductor layer;
   b. depositing an oxide of a metallic impurity on the then exposed surface of the insulator$_1$ layer in an amount yielding between about $10^{14}$ and $4 \times 10^{15}$ nuclei of the metallic impurity per square centimeter; followed by
   c. forming the insulator$_2$ layer on the insulator$_1$ layer.

3. The structure of claim 2 in which the semiconductor is a silicon wafer, the insulator$_1$ layer is silicon dioxide grown on a major surface of the silicon wafer, and the metallic impurity is tungsten.

4. The structure of claim 2 in which the oxide of the metallic impurity is tungsten trioxide.

5. In a method for fabricating a memory apparatus comprising a semiconductor insulator$_1$-insulator$_2$-metal layered structure which contains metallic impurities in a predetermined molecularly dispersed surface concentration, without clumping which would form a Fermi level of the metallic impurities, in an interface insulator region (including the interface of the insulator layers), said impurities in a concentration supplying suitable states for the capture of electronic charges in said region, the step of depositing molecules of an oxide of the metallic impurity on the then exposed surface of the insulator$_1$ layer in an amount yielding said surface concentration of metallic impurities.

6. The method of claim 1 in which the oxide of the metallic impurity is tungsten trioxide and in which the step of depositing said tungsten trioxide is carried out in an ambient at a predetermined pressure of oxygen in which a heated tungsten body is located at a predetermined distance from said then exposed surface of the insulator$_1$ layer.

7. The method of claim 2 in which the surface concentration corresponds to between about $1 \times 10^{14}$ and $4 \times 10^{15}$ tungsten nuclei per square centimeter.

8. The method of claim 1 in which the metal is tungsten.

9. The method of claim 8 in which the surface concentration is between about $1 \times 10^{14}$ and $4 \times 10^{15}$ tungsten nuclei per square centimeter.

10. The method of claim 9 in which the surface concentration is between about $5 \times 10^{14}$ and $2 \times 10^{15}$ per square centimeter.

11. In a method for fabricating a semiconductor insulator$_1$-insulator$_2$-metal layered structure, in which the semiconductor is essentially silicon and in which the insulator$_1$ layer is essentially silicon dioxide, and in which a first interface insulator region (including the interface of the insulator layers) contains metal impurity nuclei which are dispersed in said insulator region without clumping which would form a Fermi level of the metal impurity, the step of depositing molecules of an oxide of the metal impurity on the then exposed surface of the insulator$_1$ layer to a surface concentration corresponding to between about $1 \times 10^{14}$ and about $4 \times 10^{15}$ of said metal impurity nuclei per square centimeter prior to depositing the insulator$_2$ layer.

12. The method of claim 11 in which the said surface concentration is between about $5 \times 10^{14}$ and $2 \times 10^{15}$ per square centimeter.

13. The method of claim 12 in which the metal impurity is tungsten.

14. The method of claim 11 in which the metal impurity is tungsten.

15. The method of claim 14 in which the oxide of the metal impurity is tungsten trioxide.

16. The product made by the process of claim 11.

* * * * *